United States Patent
Sakurayama

(10) Patent No.: US 10,750,648 B2
(45) Date of Patent: Aug. 18, 2020

(54) COMPONENT MOUNTING APPARATUS AND SUCTION POSITION SETTING METHOD

(71) Applicant: FUJI CORPORATION, Chiryu-shi (JP)

(72) Inventor: Takeshi Sakurayama, Nisshin (JP)

(73) Assignee: FUJI CORPORATION, Chiryu-shi (JP)

( * ) Notice: Subject to any disclaimer, the term of this patent is extended or adjusted under 35 U.S.C. 154(b) by 265 days.

(21) Appl. No.: 15/578,328

(22) PCT Filed: Jun. 2, 2015

(86) PCT No.: PCT/JP2015/065904
§ 371 (c)(1),
(2) Date: Nov. 30, 2017

(87) PCT Pub. No.: WO2016/194136
PCT Pub. Date: Dec. 8, 2016

(65) Prior Publication Data
US 2018/0153062 A1    May 31, 2018

(51) Int. Cl.
*H05K 13/04*    (2006.01)
*H05K 13/08*    (2006.01)

(52) U.S. Cl.
CPC ....... *H05K 13/0417* (2013.01); *H05K 13/081* (2018.08); *H05K 13/083* (2018.08); *H05K 13/0813* (2018.08)

(58) Field of Classification Search
CPC . B65G 15/58; H05K 13/0417; H05K 13/0813
See application file for complete search history.

(56) References Cited

U.S. PATENT DOCUMENTS

| 5,566,447 A | 10/1996 | Sakurai |
| 6,374,986 B1 * | 4/2002 | Oe ........................ B65G 15/58 198/396 |

(Continued)

FOREIGN PATENT DOCUMENTS

| EP | 0 660 657 A1 | 6/1995 |
| EP | 1 178 719 A2 | 2/2002 |
| JP | 6-244598 A | 9/1994 |

OTHER PUBLICATIONS

International Search Report dated Sep. 1, 2015, in PCT/JP2015/065904, filed Jun. 2, 2015.

(Continued)

*Primary Examiner* — Carl J Arbes
(74) *Attorney, Agent, or Firm* — Oblon, McClelland, Maier & Neustadt, L.L.P.

(57) ABSTRACT

A component mounting apparatus sets a position that is offset with respect to a suction reference position of a component toward the front side in a feeding direction as a suction position based on a difference between a dimension of the recess-shaped cavity in the Y-direction and a dimension of the component accommodated in the cavity in the Y-direction and sucks the component. Therefore, even if the component in the cavity positionally deviates toward the front side in the feeding direction due to inertia when a carrier tape is stopped, a suction nozzle sucks an appropriate position of the component.

11 Claims, 5 Drawing Sheets

(56) References Cited

U.S. PATENT DOCUMENTS

| | | | | |
|---|---|---|---|---|
| 6,631,552 B2 * | 10/2003 | Yamaguchi | ........ | H05K 13/0813 29/739 |
| 7,712,208 B2 * | 5/2010 | Watanabe | .......... | H05K 13/0417 29/740 |
| 7,930,819 B2 * | 4/2011 | Yonemitsu | ......... | H05K 13/0417 226/76 |
| 2002/0056188 A1 * | 5/2002 | Yamaguchi | ........ | H05K 13/0417 29/743 |
| 2008/0283191 A1 | 11/2008 | Nakane | | |
| 2010/0313407 A1 | 12/2010 | Ohno et al. | | |

OTHER PUBLICATIONS

European Search Report dated May 3, 2018 in Patent Application No. 15894171.6, 9 pages.

* cited by examiner

[FIG. 1]
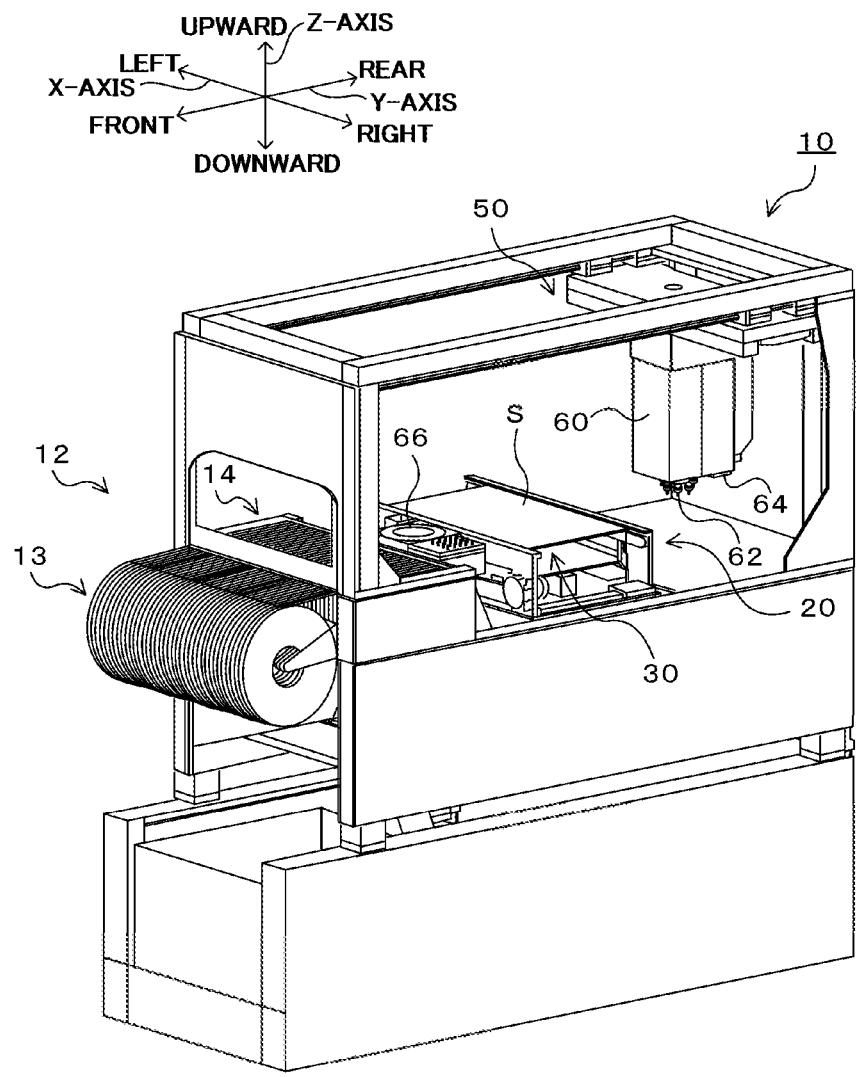

[FIG. 2]
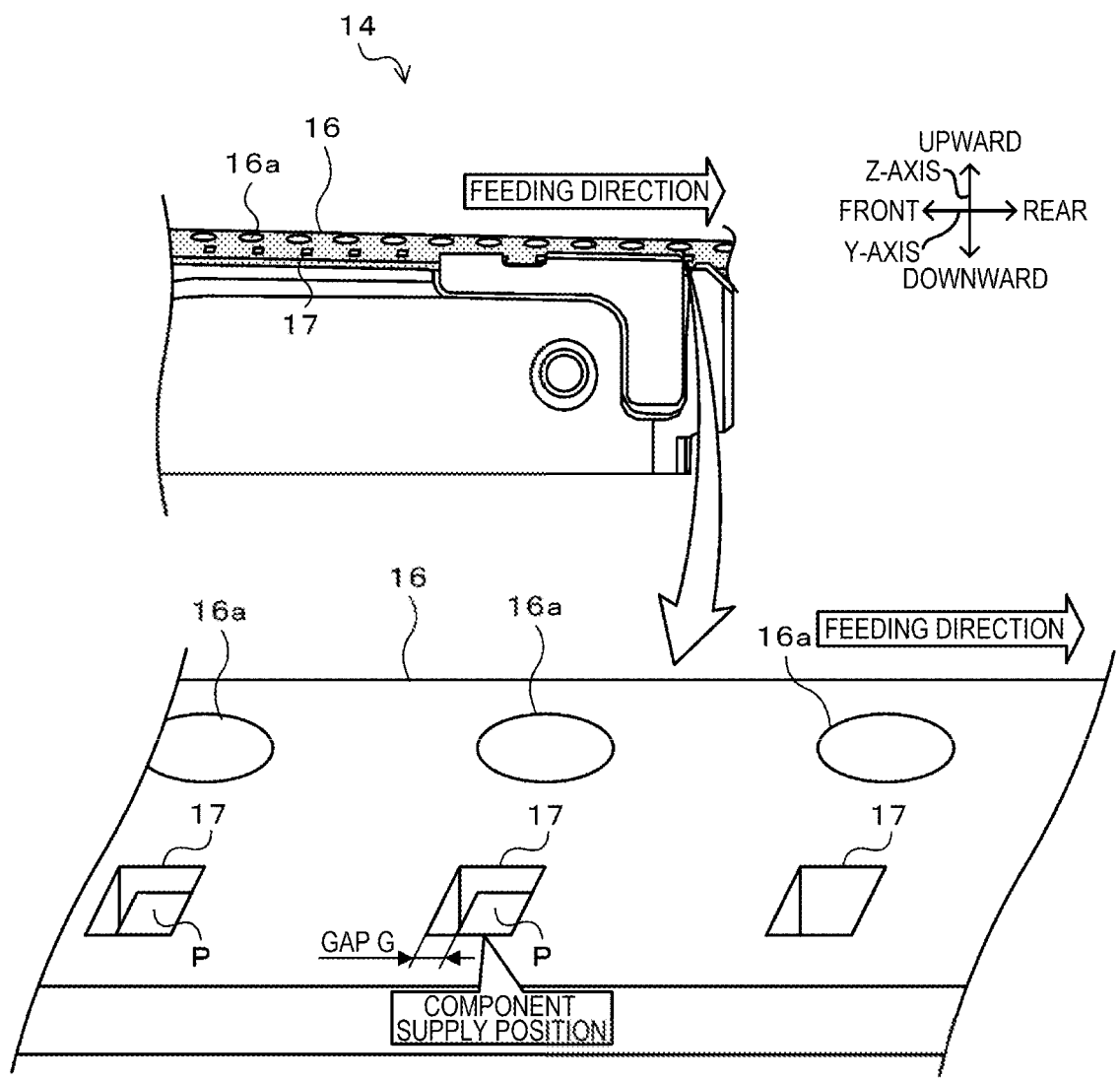

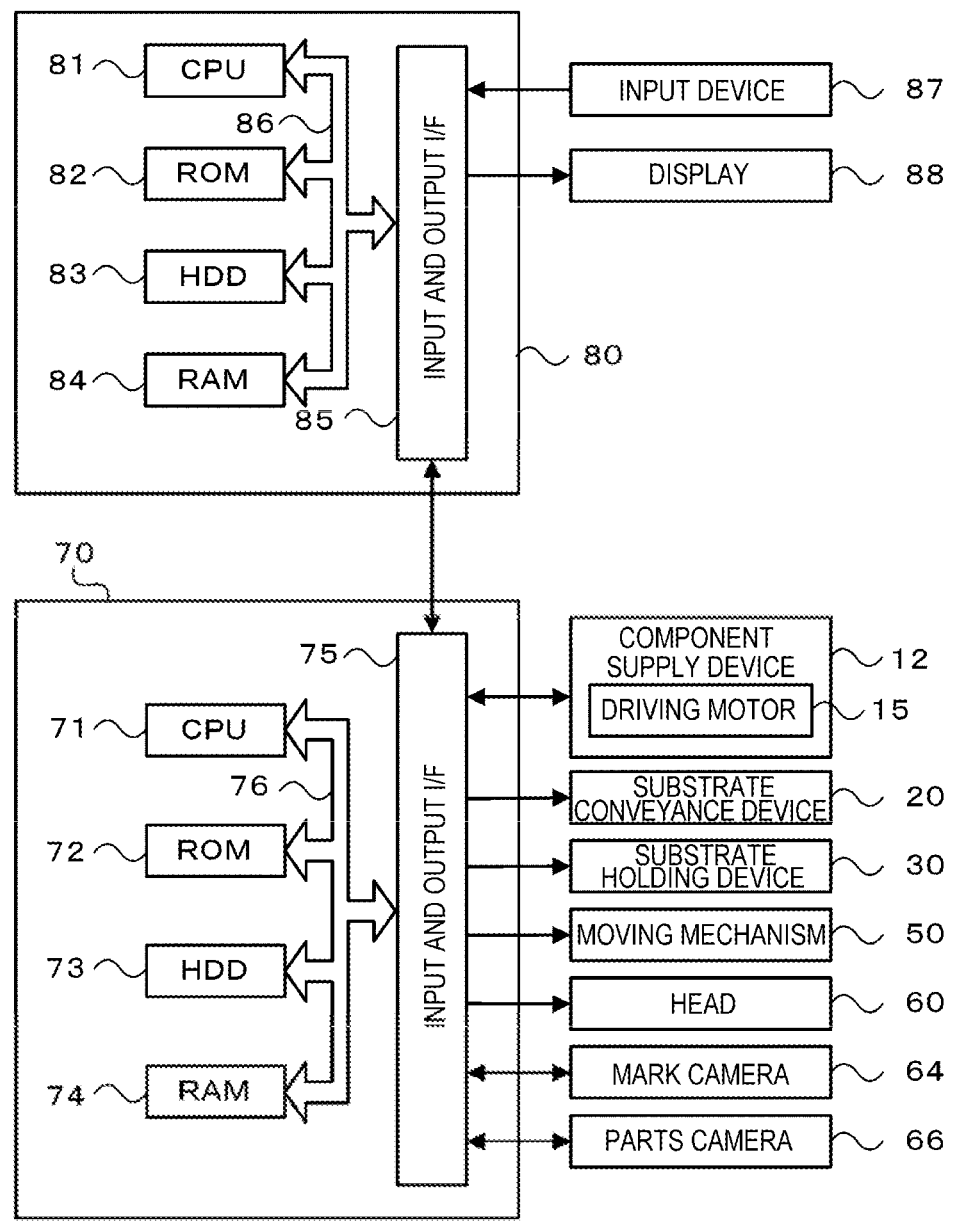
[FIG. 3]

[FIG. 4]
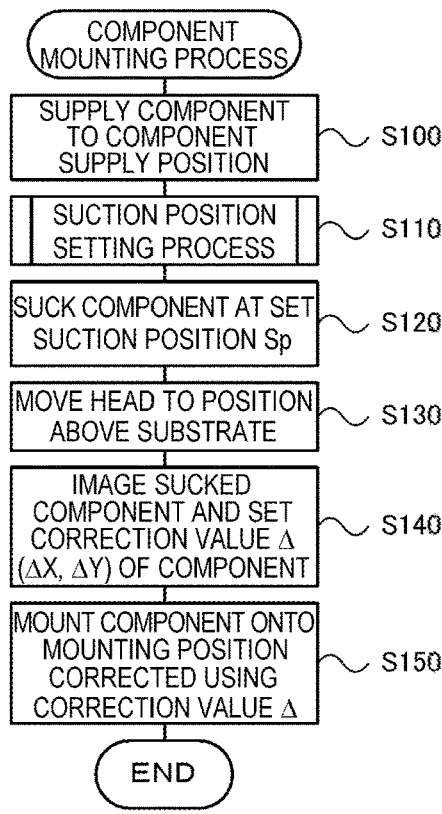
[FIG. 5]
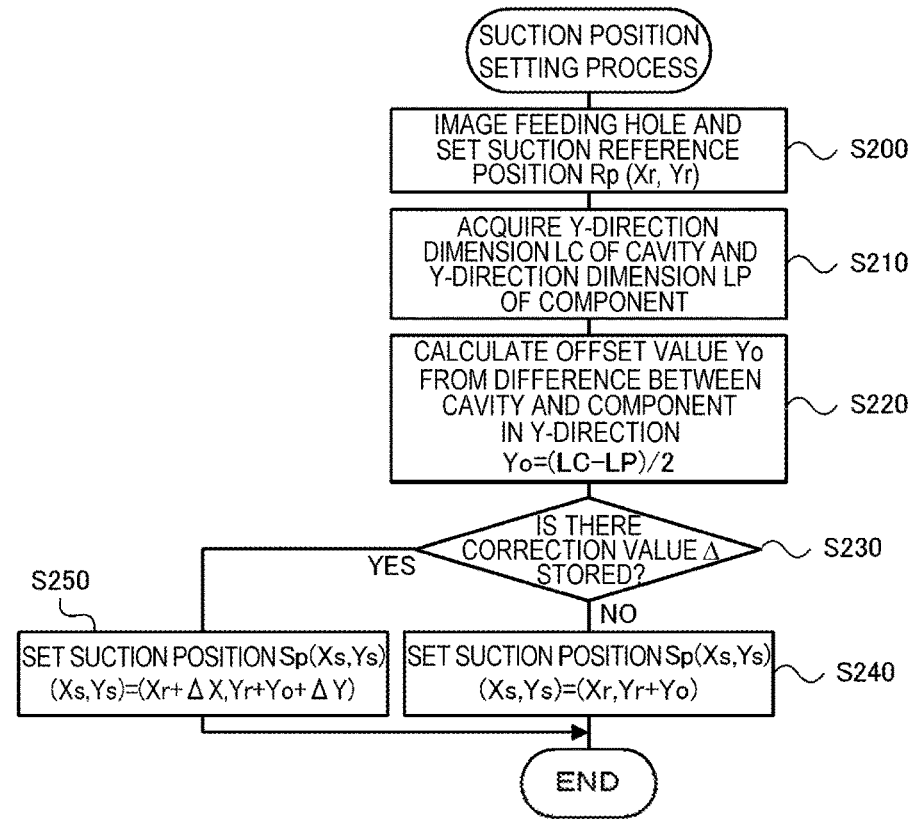

[FIG. 6]
(a)
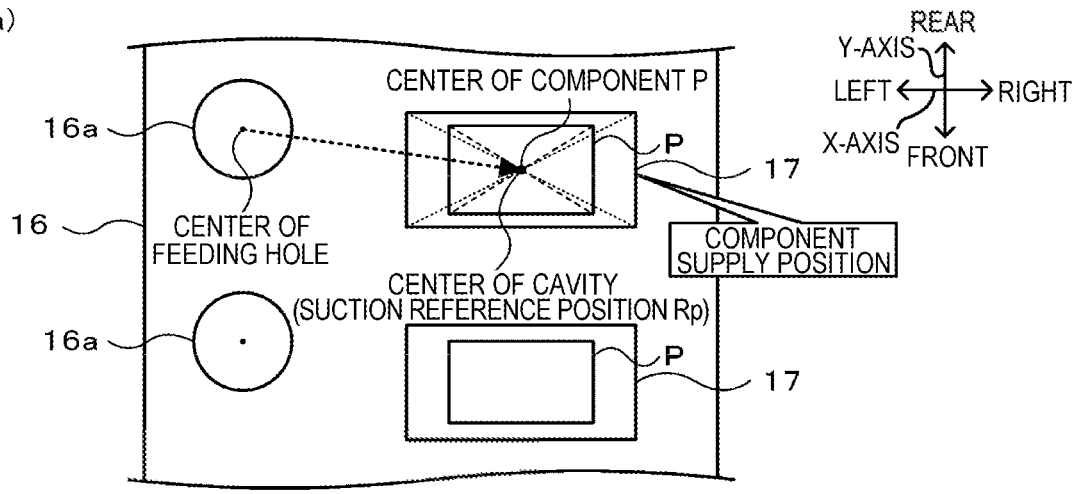
(b)
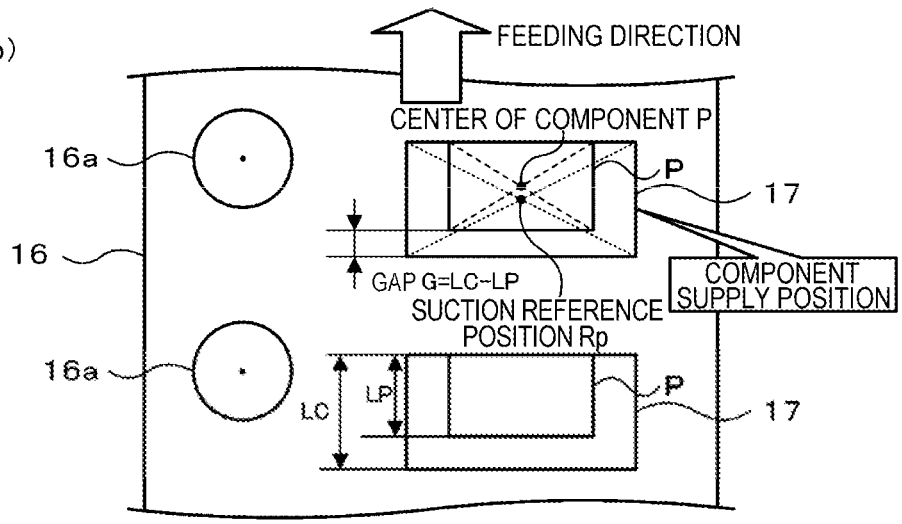
(c)
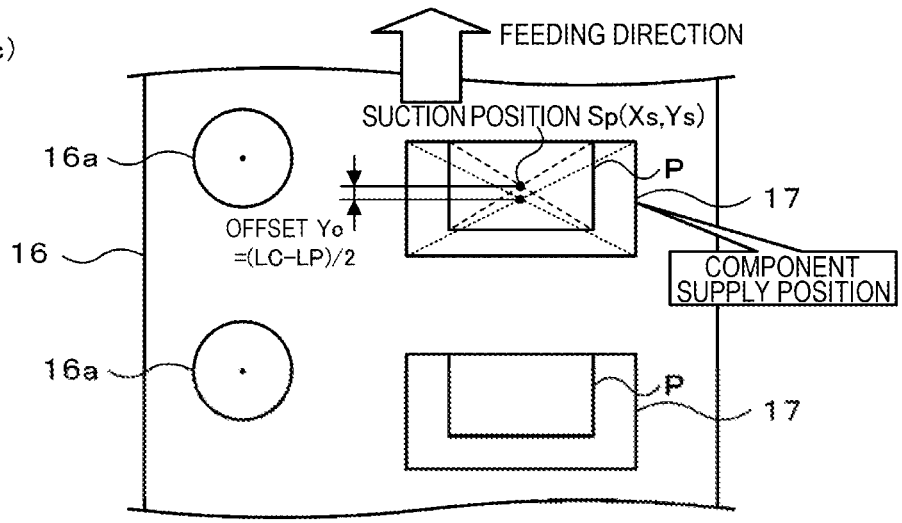

COMPONENT MOUNTING APPARATUS AND SUCTION POSITION SETTING METHOD

TECHNICAL FIELD

The present application relates to a component mounting apparatus and a suction position setting method.

BACKGROUND ART

In the related art, there is a known component mounting apparatus to which a component supply device that supplies components by feeding a tape, on which a plurality of accommodation sections for accommodating the components are formed, is detachably attached and which sucks the components with a nozzle and mounts the components on a substrate. A component mounting apparatus disclosed in PTL 1 detects a mark provided on a predetermined position on a component supply device, measures a deviation amount of an attachment position of the component supply device, and corrects a position at which a nozzle sucks a component based on the deviation amount in order to stably pick up the component from an accommodation section and to increase mounting accuracy.

CITATION LIST

Patent Literature

PTL 1: JP-A-6-244598

SUMMARY

Technical Problem

With the component mounting apparatus in PTL 1, it is possible to appropriately cope with deviation of the attachment position of the component supply device. However, coping with positional deviation of each component inside the accommodation section has not been taken into consideration. Here, generally, the accommodation section accommodates the component not tightly. Therefore, there is a case where the component in the accommodation section moves within the accommodation section and positional deviation occurs due to inertia or the like when a tape is stopped. Meanwhile, there is a case where the component mounting apparatus cannot accurately detect an upper surface of the component in the accommodation section due to influence of various characters or the like printed on the upper surface of the component. Therefore, there is a case where the component mounting apparatus cannot appropriately cope with positional deviation of the component in the accommodation section and cannot stably pick up the component, which results in a decrease in mounting accuracy.

A main object of the present disclosure is to stably pick up a component from an accommodation section in order to improve component mounting accuracy.

Solution to Problem

The present disclosure has adopted the following means in order to achieve the above-described main object.

A component mounting apparatus according to the disclosure is a component mounting apparatus which sucks a component and mounts the component on a substrate, the apparatus including component supplying means for supplying the component by intermittently feeding an accommodation member on which a plurality of accommodation sections for accommodating the component are formed in a predetermined direction, suction position setting means for setting a position that is offset from a reference position, which is reference for suction of the component, in a direction toward a side to which the component moves due to inertia as a suction position based on a difference between a dimension of the accommodation section in the predetermined direction and a dimension of the component accommodated in the accommodation section in the predetermined direction, and component mounting means for sucking the component supplied by the component supplying means at the suction position to pick up the component from the accommodation section and mounting the component onto the substrate.

The component mounting apparatus according to the disclosure can suck an appropriate position on the component since the position offset in the direction toward the side to which the component moves due to inertia is set as the suction position. As a result, the component mounting apparatus can stably pick up the component from the accommodation section and thus it is possible to achieve an improvement in component mounting accuracy.

BRIEF DESCRIPTION OF DRAWINGS

FIG. 1 is a configuration view schematically illustrating a configuration of a component mounting apparatus 10.

FIG. 2 is a configuration view schematically illustrating a configuration of a component supply device 12.

FIG. 3 is a block diagram illustrating a configuration related to control of the component mounting apparatus 10.

FIG. 4 is a flowchart illustrating an example of a component mounting process that is executed by a CPU 71 of a control device 70.

FIG. 5 is a flowchart illustrating an example of a suction position setting process that is executed by the CPU 71 of the control device 70.

FIG. 6 is an explanation view how a suction position of a component is set.

DESCRIPTION OF EMBODIMENTS

FIG. 1 is a configuration view schematically illustrating a configuration of a component mounting apparatus 10, FIG. 2 is a configuration view schematically illustrating a configuration of a component supply device 12, and FIG. 3 is a block diagram illustrating a configuration related to control of the component mounting apparatus 10. In the present embodiment, a left-right direction in FIG. 1 is an X-direction, a front-rear direction is a Y-direction, and an up-down direction is a Z-direction.

As illustrated in FIG. 1, the component mounting apparatus 10 includes the component supply device 12 that supplies components P accommodated in a tape, a substrate conveyance device 20 that conveys a flat plate-shaped substrate S, a substrate holding device 30 that holds the conveyed substrate S, a head 60 that sucks the components P with suction nozzles 62 and mounts the components P on the substrate S, and a moving mechanism 50 that moves the head 60 in an XY-directions. In addition, the component mounting apparatus 10 includes a mark camera 64 that can image various marks on the substrate S or a predetermined position on an upper face of the tape in the component supply device 12, a parts camera 66 that can image the components P sucked by the suction nozzles 62 from below, and a control device 70 (refer to FIG. 3) that controls the entire component mounting apparatus 10. The head 60 includes a plurality of (for example, twelve) suction nozzles 62 and the suction nozzles 62 are lifted or lowered in an up-down direction by a Z-axis motor (not shown). Examples of the substrate S include a printed wiring board that is a circuit board, a printed circuit board in which an electronic circuit component is installed and electrically connected onto one surface and no electronic circuit component is mounted on the other surface, a bare-chip-installed substrate constituting a board with a chip, a substrate on which an electronic circuit component including a ball grid array is installed, and the like.

The component supply device 12 includes a reel 13 on which a carrier tape 16 (refer to FIG. 2) is wound and a feeder section 14 that draws the carrier tape 16 from the reel 13 and feeds the carrier tape 16. The component supply device 12 is detachably attached to the component mounting apparatus 10. The feeder section 14 includes a driving motor 15 (refer to FIG. 3) such as a stepping motor for rotating a sprocket (not shown). On the carrier tape 16, a plurality of recess-shaped cavities 17 for accommodating the components P are formed at predetermined intervals in a longitudinal direction. In addition, on the carrier tape 16, feeding holes 16a that engage with sprocket teeth formed on the outer peripheral portion of the sprocket of the feeder section 14 are formed. The feeding holes 16a are formed at the same intervals as the cavities 17. The component supply device 12 supplies the components P to a component supply position at which the head 60 (the suction nozzles 62) can pick up the components P by driving the driving motor 15 of the feeder section 14 such that the sprocket is intermittently rotated and the carrier tape 16 is intermittently fed rearwards in the Y-direction (a predetermined direction), the carrier tape being fed by a predetermined amount for each time the carrier tape is fed. In addition, although not illustrated, the component supply device 12 includes a control section that includes a CPU, a ROM, a RAM, and the like. When the component supply device 12 is attached to the component mounting apparatus 10, the control section is connected to the control device 70 such that the control section can communicate with the control device 70.

The cavity 17 is formed to have a size greater than the component P in order to be capable of accommodating the component P not tightly. Therefore, the component P can move within the cavity 17. Accordingly, when the carrier tape 16 is stopped, the component P moves forwards in a feeding direction (rearwards in the Y-direction) within the cavity 17 due to inertia and stops after colliding with an inner wall of the cavity 17. Accordingly, as illustrated in an enlarged view in FIG. 2, the component P is supplied to the component supply position in a state of being deviated closer to the front side in the feeding direction (the rear side in the Y-direction) within the cavity 17. Note that, in a state where the component P has positionally deviated within the cavity, a gap G in the Y-direction is formed on only the rear side in the feeding direction (the front side in the Y-direction).

As illustrated in FIG. 3, the control device 70 is configured as a microprocessor with a CPU 71 as a main component and includes a ROM 72, an HDD 73, a RAM 74, and an input and output interface 75 in addition to the CPU 71. The above-described components are electrically connected to each other via a bus 76. Various information related to the accommodated components P from the control section of the component supply device 12, an image signal from the mark camera 64, or an image signal from the parts camera 66 is input to the control device 70 via the input and output interface 75. Meanwhile, a drive signal to the component supply device 12, a drive signal to the substrate conveyance device 20, a drive signal to the substrate holding device 30, a drive signal to the moving mechanism 50, a drive signal to the head 60, or the like is output from the control device 70 via the input and output interface 75. In addition, the control device 70 is connected to a management device 80 that manages information related to a mounting process via a communication network such that bidirectional communication therebetween can be performed and the control device 70 and the management device 80 receive or transmit data or a control signal from or to each other.

The management device 80 is, for example, a general-purpose computer and includes a CPU 81, a ROM 82, an HDD 83, a RAM 84, and an input and output interface 85. The above-described components are electrically connected to each other via a bus 86. An input signal from an input device 87 such as a mouse or a keyboard is input to the management device 80 via the input and output interface 85. In addition, the management device 80 outputs an image signal to a display 88 via the input and output interface 85. The HDD 83 stores a production plan for the substrate S. The production plan for the substrate S is a plan that determines which component P is mounted onto which position on a mounting surface of the substrate S in the component mounting apparatus 10, the order in which components P are mounted, and the number of substrates S to be manufactured onto each of which the component P is mounted. The management device 80 outputs a command signal to the control device 70 such that the components P are mounted in accordance with the production plan.

Hereinafter, an operation of the component mounting apparatus 10 configured as described above will be described. FIG. 4 is an example of a component mounting process that is executed by the CPU 71 of the control device 70. The CPU 71 of the control device 70 executes the process when receiving the command signal from the management device 80.

In the component mounting process, first, the CPU 71 supplies the components P to the component supply position by controlling the component supply device 12 (S100) and executes a suction position setting process of setting a position at which the suction nozzles 62 suck the supplied components P (S110). The suction position setting process is a process of setting a suction position Sp through various types of correction with respect to a suction reference position Rp which is reference for suction of the components P and details thereof will be described later. Next, the CPU 71 executes a suction process of controlling the moving mechanism 50 and the head 60 such that the head 60 moves to the suction position Sp that is set in S110 and the suction nozzles 62 suck the components P (S120). Note that, since the head 60 includes the multiple suction nozzles 62, the processes in S100 to S120 are repeated until all of the suction nozzles 62 suck the components P.

When the suction nozzles 62 suck the components P, the CPU 71 controls the moving mechanism 50 such that the head 60 moves to a position above the substrate S via a position above the parts camera 66 (S130). In addition, when the head 60 is positioned above the parts camera 66, the CPU 71 images the component P sucked by the suction nozzles 62 with the parts camera 66, detects a suction deviation amount of the components P with respect to the suction nozzles 62 by processing the obtained image, and sets a correction value Δ with respect to a mounting position of the components P based on the detected suction deviation amount (S140). Regarding the correction value Δ, each of a correction value ΔX for correcting suction deviation in the X-direction and a correction value ΔY for correcting suction deviation in the Y-direction is set and stored in the RAM 74. Note that, since the head 60 includes the multiple suction nozzles 62, the correction value Δ is set for each suction nozzle 62 (each component P). As described above, the correction value Δ is set when the head 60 moves to a position above the substrate S after the suction nozzles 62 suck the components P. Next, the CPU 71 controls the moving mechanism 50 and the head 60 such that the head 60 moves to a position above a mounting position obtained through correction using the correction value Δ and the suction nozzles 62 sequentially mount the components P on the substrate S (S150). Thereafter, the component mounting process is terminated.

Hereinafter, the suction position setting process in S110 will be described. FIG. 5 is an example of the suction position setting process that is executed by the CPU 71 of the control device 70. In the suction position setting process, first, the CPU 71 images the feeding hole 16a that is closest to the component supply position with the mark camera 64 and sets the suction reference position Rp (Xr, Yr) by processing the obtained image (S200). For example, the center position in the cavity 17 is determined as the suction reference position Rp (Xr, Yr). In addition, distances between the center position of the cavity 17 and the center position of the feeding hole 16a (a distance in the X-direction and a distance in the Y-direction) are predetermined. Note that, since the interval between the feeding holes 16a and the interval between the cavities 17 are equal to each other, a relative position with respect to the closest feeding hole 16a is the same for any of the cavities 17. In S200, the CPU 71 detects the feeding hole 16a that is closest to the component supply position and determines the center position thereof by processing the obtained image, obtains the center position of the cavity 17 that is separated from the center position of the feeding hole 16a by a predetermined distance, and sets the center position as the suction reference position Rp (Xr, Yr).

Next, the CPU 71 acquires a Y-direction dimension (a length) LC of the cavity 17 and a Y-direction dimension (a length) LP of the component P (S210) and halves a difference between the Y-direction dimension LC and the Y-direction dimension LP (LC-LP) by dividing the difference by 2 to calculate an offset value Yo in the Y-direction (S220). The CPU 71 may acquire the Y-direction dimension LC of the cavity 17 and the Y-direction dimension LP of the component P from the control section of the component supply device 12 through communication and may acquire the Y-direction dimension LC of the cavity 17 and the Y-direction dimension LP of the component P from the management device 80 through communication. Alternatively, the HDD 73 of the control device 70 may store the Y-direction dimension LP corresponding for each component type and the Y-direction dimension LC of the cavity 17 and the CPU 71 may acquire the Y-direction dimension LP corresponding to the type of the current mounted component P and the Y-direction dimension LC of the cavity 17 by reading the dimensions from the HDD 73. In addition, the CPU 71 may not calculate the offset value Yo every time and the predetermined offset value Yo may be used for the components P supplied from the same feeder section 14. In addition, the offset value Yo calculated by an operator may be used. For example, the CPU 71 may acquire the offset value Yo, which is calculated by the operator in advance, from the management device 80 through communication.

When the offset value Yo is calculated, the CPU 71 determines whether there is a correction value Δ with respect to the mounting position stored in the RAM 74 or not (S230). When it is determined that there is no correction value Δ stored, the CPU 71 sets a position (Xr, Yr+Yo) obtained through correction in which the offset value Yo is reflected on the suction reference position Rp (Xr, Yr) as the suction position Sp (Xs, Ys) (S240). Thereafter, the suction position setting process is terminated.

Here, FIG. 6 is an explanation view illustrating how the suction position is set. As described above, the suction reference position Rp is set to the center position of the cavity 17 that is separated from the center of the feeding hole 16a by the predetermined distance in the predetermined direction (FIG. 6(a)). Therefore, as illustrated in FIG. 6(a), if there is no positional deviation of the component P and the component P is positioned at the center of the cavity 17, the suction nozzle 62 can suck the center position of the component P by sucking the component P at the suction reference position Rp. However, actually, as illustrated in FIG. 6(b), the component P moves forwards in the feeding direction within the cavity 17 and positionally deviates due to influence of inertia when the carrier tape 16 is stopped. The gap G generated due to the positional deviation of the component P corresponds to the difference (LC-LP) between the Y-direction dimension LC of the cavity 17 and the Y-direction dimension LP of the component P. Therefore, in the present embodiment, as illustrated in FIG. 6(c), the half of the difference (LC-LP) corresponding to the gap G is set as the offset value Yo and a position that is offset from the suction reference position Rp in a direction toward the front side in the feeding direction (the rear side in the Y-direction) based on the offset value Yo is set as the suction position Sp. Accordingly, the suction nozzle 62 can appropriately suck the center position of the component P positionally deviating within the cavity 17. Since the suction nozzle 62 sucks the component P at a position deviated from the center position, it is possible to prevent the posture of the component P from being unstable at the time of suction and to prevent suction failure. That is, it is possible for the suction nozzle 62 to stably suck the component P and it is possible to achieve an improvement in mounting accuracy of the component P. Note that, for convenience of explanation, a case where the component P is rectangular and the center position of the cavity 17 is set as the suction reference position Rp has been described as an example. However, the disclosure is not limited to this and the CPU 71 can set a position offset based on the offset value Yo as the suction position Sp even in a case where the component P is heteromorphic and a position other than the center position of the cavity 17 is set as the suction reference position Rp.

Meanwhile, when it is determined that there is a stored correction value Δ in S230, the CPU 71 sets a position (Xs+ΔX, Ys+Yo+ΔY) obtained through correction, in which the offset value Yo is reflected on the suction reference position Rp (Xr, Yr) and the correction value ΔX in the X-direction and the correction value ΔY in the Y-direction are used, as the suction position Sp (Xs, Ys) (S250). Thereafter, the suction position setting process is terminated. Therefore, the suction nozzle 62 can suck the component P at a position obtained by reflecting not only the offset value Yo in a direction toward the front side in the feeding direction (the rear side in the Y-direction) but also the correction value Δ and thus it is possible to stably suck the component P. Note that, in a case where there are stored correction values Δ (ΔX, ΔY) for multiple components P, the average value or the median thereof can be used. In addition, as described above, the correction value Δ is set when the suction nozzle 62 sucks the component P and the head 60 moves to a position above the substrate S. Therefore, the correction value Δ has not been set (stored) in a case where the suction nozzle 62 sucks the component P for the first time after the reel 13 is attached to the component mounting apparatus 10. Even in this case, the CPU 71 sets a position obtained by reflecting the offset value Yo in the process in S240 as the suction position Sp. Therefore, the suction nozzle 62 can stably suck the component P even when the suction nozzle 62 suck the component P for the first time. As described above, when the component P is sucked for the first time, the CPU 71 can perform correction using the offset value Yo as in S240 and when the component P is sucked for the second or subsequent time, the CPU 71 can perform correction using the offset value Yo and the correction value Δ (the correction value ΔX and the correction value ΔY) in combination as in S250. In addition, for example, in a case of the head 60 including twelve suction nozzles 62, which are a nozzle A to a nozzle L, the CPU 71 can perform correction using the offset value Yo when each nozzle sucks the component P for the first time (the nozzle A(1), the nozzle B(1), . . . , the nozzle L(1)). In addition, the CPU 71 can perform correction using the offset value Yo and the correction value Δ (the correction value ΔX and the correction value ΔY) in combination when each nozzle sucks the component P for the second or subsequent time (the nozzle A(2), the nozzle B(2), . . . , the nozzle L(2)).

Here, a correspondence relationship between constituent elements in the present embodiment and constituent elements in the present disclosure will be clarified. The cavity 17 in the present embodiment corresponds to an accommodation section, the carrier tape 16 corresponds to an accommodation member, the component supply device 12 corresponds to component supplying means, the CPU 71 of the control device 70 that executes S110 (the suction position setting process in FIG. 5) in the component mounting process in FIG. 4 corresponds to suction position setting means, the CPU 71 of the control device 70 that executes S120 and S150 in the component mounting process corresponds to component mounting means. In addition, the parts camera 66 and the CPU 71 of the control device 70 that executes the process in S140 in the component mounting process correspond to imaging means. Note that, the present embodiment clarifies an example of a suction position setting method of the disclosure by describing an operation of the component mounting apparatus 10.

The component mounting apparatus 10 as described above sets a position that is offset with respect to the suction reference position Rp of the component P (the center position of the cavity 17) toward a side to which the component P moves due to inertia (the rearward direction in the Y-direction) as the suction position Sp based on a difference between a dimension of the recess-shaped cavity 17 in the Y-direction and a dimension of the component P accommodated in the cavity 17 in the Y-direction and sucks the component P. Therefore, even if the component P in the cavity 17 positionally deviates due to inertia when the carrier tape 16 is stopped after feeding the component P to the component supply position, the suction nozzle 62 can suck an appropriate position of the component P and to stably pick up the component P from the cavity 17. Therefore, according to the component mounting apparatus 10, it is possible to achieve an improvement in mounting accuracy of the component P.

In addition, the component mounting apparatus 10 sets a position that is offset with respect to the suction reference position Rp toward a side to which the component P moves due to inertia by the half of a difference between a dimension of the cavity 17 in the Y-direction and a dimension of the component P in the Y-direction as the suction position Sp. After the component P moves due to the inertia, the component P stops after colliding with an inner wall of the cavity 17 that is on the front side in the feeding direction. At this time, the upper limit of a movement amount of the component P is the half of a gap between the cavity 17 and the component P in the Y-direction (a difference between the dimensions in the Y-direction). Therefore, since the position is offset by the half of the difference, it is possible for the suction nozzle 62 to more stably pick up the component P.

In addition, the component mounting apparatus 10 images the component P from below before the component P picked up from the cavity 17 is mounted on the substrate S, obtains the correction value Δ based on a positional deviation amount of the component P based on the captured image, and corrects the mounting position. In addition, since the correction value Δ is used for correction of the suction position when the suction nozzle 62 sucks the next component P, it is possible to appropriately cope with not only positional deviation of the component P in the Y-direction (the feeding direction) within the cavity 17 but also positional deviation of the component P in the X-direction (a direction orthogonal to the feeding direction). In addition, it is possible to appropriately cope with a case where positional deviation of the component P in the Y-direction is smaller than as expected, for example, a case where the component P in the cavity 17 tends to stop without colliding with the inner wall that is on the front side in the feeding direction.

Note that, the present disclosure is not limited to the above-described embodiment and it is a matter of course that various embodiments can be made without departing a technical scope of the disclosure.

For example, in the above-described embodiment, the CPU 71 sets the center position of the cavity 17 as the suction reference position Rp based on the position of the feeding hole 16a detected from an image captured by the mark camera 64. That is, the CPU 71 sets the center position of the cavity 17, which is indirectly detected, as the suction reference position Rp. However, the disclosure is not limited to this and the CPU 71 may directly detect the cavity 17 from an image captured by the mark camera 64 and set the center position of the cavity 17 as the suction reference position Rp.

In the above-described embodiment, the feeding holes 16a and the cavities 17 are formed at the same intervals. However, the disclosure is not limited to this and the feeding holes 16a and the cavities 17 may be formed at different intervals. For example, in a case where the cavities 17 are formed at intervals each of which is smaller than an interval between the feeding holes 16a, a distance and a direction with respect to the feeding hole 16a as a reference may be predetermined for each cavity 17. In addition, the cavity 17 may be imaged by the mark camera 64 along with the feeding hole 16a as the reference. In this case, the CPU 71 can indirectly set the suction reference position Rp to the center position of the cavity 17 based on the position of the feeding hole 16a as the reference.

In the above-described embodiment, in a case where there is no correction value Δ stored such as a case where the component P is mounted for the first time, the CPU 71 corrects the suction position Sp only in the Y-direction by using the offset value Yo. However, the disclosure is not limited to this and the correction may be performed in the X-direction also. For example, the mark camera 64 may image the component P in the cavity 17 and the CPU 71 may detect positional deviation of the component P in the X-direction by processing the obtained image such that correction in the X-direction is performed based on a detected positional deviation amount. Here, generally, the rectangular component P is accommodated in the cavity 17 with the longitudinal direction thereof being parallel to the X-direction and the transverse direction thereof being parallel to the Y-direction. In addition, identification information (a character or a symbol) of the component P is provided on the upper face of the component P in many cases. Therefore, for example, in a case where the CPU 71 processes an image of an upper face of an extremely small component (for example, the length thereof is less than 1 mm in any of the X-direction and the Y-direction), it is not possible to appropriately detect opposite end positions in a transverse direction due to influence of identification information on an upper face and it is possible to favorably detect opposite end positions in a longitudinal direction while being relatively not influenced by the identification information, in some cases. Accordingly, the CPU 71 may uniformly perform correction using the offset value Yo with respect to the Y-direction as described in the embodiment and may perform correction based on a positional deviation amount that is detected from an image obtained through an imaging operation with respect to the X-direction. As a result, according to this alternative embodiment, it is possible to appropriately cope with positional deviation of the component P in the X-direction and positional deviation of the component P in the Y-direction.

In the above-described embodiment, the CPU 71 performs correction based on the correction value Δ and correction based on the offset value Yo in a case where there is a correction value Δ with respect to the mounting position stored. However, the disclosure is not limited to this and the CPU 71 may perform the correction based on the offset value Yo without performing the correction based on the correction value Δ even if there is a correction value Δ stored. In addition, the CPU 71 may perform correction using the correction value Δ with respect to the X-direction and may perform correction based on the offset value Yo with respect to the Y-direction without performing correction based on the correction value Δ.

In the above-described embodiment, the offset value Yo in the Y-direction is a value obtained by dividing a difference between the Y-direction dimension LC of the cavity 17 and the Y-direction dimension LP of the component P, that is the half of the difference. However, the disclosure is not limited to this and any offset value may be used as long as the upper limit thereof is the half of the difference. That is, the proportion of the offset value to the difference is not limited to the half (50%) and the proportion of the offset value to the difference may be 30% or 40%. In addition, the proportion of the offset value to the difference may not be uniform and may become different depending on the weight, the size, the shape, the type or the like of the component P.

In the above-described embodiment, a case where the component supply device 12 feeds the carrier tape 16 (the component P) in a predetermined direction (a first direction, toward the rear side in the Y-direction) and the component P moves in the predetermined direction due to inertia has been considered. However, the carrier tape 16 may not be fed in the predetermined direction and may be fed in a direction opposite to the predetermined direction (a second direction, toward the front side in the Y-direction). For example, there is a case where the operator feeds the carrier tape 16 by operating a button or the like when the reel 13 is attached to the component supply device 12 and the leading component P on the carrier tape 16 is positioned. At this time, if the leading component P excessively advances in the predetermined direction and passes the component supply position, the operator feeds the carrier tape 16 in the opposite direction and stops the carrier tape 16 after the component P returns to the component supply position in some cases. In this case, correction using the offset value Yo may not be performed since it is considered that there is no positional deviation of the component P in the predetermined direction (a direction toward the rear side in the Y-direction) in the cavity 17. That is, in a case where the component P is supplied to the component supply position, the CPU 71 may determine whether the previous feeding direction of the carrier tape 16 is the predetermined direction. The CPU 71 may perform the correction using the offset value Yo if the feeding direction is the predetermined direction (a normal feeding direction) and may not perform the correction using the offset value Yo if the feeding direction is the opposite direction. Alternatively, when the carrier tape 16 being fed in the opposite direction is stopped, the component P may positionally deviate in the opposite direction (a direction toward the front side in the Y-direction). For this reason, the correction using the offset value Yo may be performed such that the suction position Sp is shifted in the opposite direction (the direction toward the front side in the Y-direction) if the previous feeding direction of the carrier tape 16 is the opposite direction. As described above, it is possible to set a position that is offset in a direction in which the component P moves due to inertia as the suction position based on the feeding direction immediately before the carrier tape 16 is stopped.

INDUSTRIAL APPLICABILITY

The disclosure can be used for a component mounting apparatus which sucks a component and mounts the component on a substrate.

REFERENCE SIGNS LIST

10: component mounting apparatus, 12: component supply device, 13: reel, 14: feeder section, 15: driving motor, 16: carrier tape, 16a: feeding hole, 17: cavity, 20: substrate conveyance device, 30: substrate holding device, 50: moving mechanism, 60: head, 62: suction nozzle, 64: mark camera, 66: parts camera, 70: control device, 71, 81: CPU, 72, 82: ROM, 73, 83: HDD, 74, 84: RAM, 75, 85: input and output interface, 76, 86: bus, 80: management device, 87: input device, 88: display, P: component, S: substrate

The invention claimed is:

1. A component mounting apparatus which sucks a component and mounts the component on a substrate, the apparatus comprising:

component supplying means for supplying the component by intermittently feeding an accommodation member, on which a plurality of accommodation sections for accommodating the component are formed, in a predetermined direction;

suction position setting means for setting a suction position that is offset from a reference position on the accommodation member, which is reference for suction of the component, in a direction toward a side of the accommodation section to which the component moves within the accommodation section due to the feeding of the accommodation member, the suction position based on a difference between a dimension of the accommodation section in the predetermined direction and a dimension of the component accommodated in the accommodation section in the predetermined direction; and component mounting means for sucking the component supplied by the component supplying means at the suction position to pick up the component from the accommodation section and mounting the component onto the substrate.

2. The component mounting apparatus according to claim 1,
wherein the suction position setting means sets the suction position that is offset with respect to the reference position in the direction toward the side by the half of the difference.

3. The component mounting apparatus according to claim 1, further comprising:
imaging means for imaging the component from below before the component that is picked up from the accommodation section by the component mounting means is mounted on the substrate,
wherein the suction position setting means obtains a positional deviation amount of the component with respect to the suction position based on an image captured by the imaging means and sets the suction position by correcting the offset position based on the positional deviation amount.

4. A suction position setting method for a component mounting apparatus which supplies a component by intermittently feeding an accommodation member, on which a plurality of accommodation sections for accommodating the component are formed, in a predetermined direction, sucks the supplied component at a suction position to pick up the component from the accommodation section, and mounts the component onto a substrate, the method comprising:
setting the suction position that is offset from a reference position on the accommodation member, which is reference for suction of the component, in a direction toward a side of the accommodation section to which the component moves within the accommodation section due to the feeding of the accommodation member, the suction position based on a difference between a dimension of the accommodation section in the predetermined direction and a dimension of the component accommodated in the accommodation section in the predetermined direction.

5. A component mounting apparatus which sucks a component and mounts the component on a substrate, the apparatus comprising:
component supplying device that supplies the component by intermittently feeding a carrier tape, on which a plurality of accommodation sections for accommodating the component are formed, in a predetermined direction; and
processing circuitry configured to
set a suction position that is offset from a reference position on the accommodation member, which is reference for suction of the component, in a direction toward a side of the accommodation section to which the component moves within the accommodation section due to the feeding of the accommodation member, the suction position based on a difference between a dimension of the accommodation section in the predetermined direction and a dimension of the component accommodated in the accommodation section in the predetermined direction; and
suck the component supplied by the component supplying device at the suction position to pick up the component from the accommodation section and mounting the component onto the substrate.

6. The component mounting apparatus according to claim 5,
wherein the processing circuitry sets the suction position that is offset with respect to the reference position in the direction toward the side by the half of the difference.

7. The component mounting apparatus according to claim 5, further comprising:
a camera that images the component from below before the component that is picked up from the accommodation section by the component mounting device is mounted on the substrate,
wherein the processing circuitry obtains a positional deviation amount of the component with respect to the suction position based on an image captured by the camera and sets the suction position by correcting the offset position based on the positional deviation amount.

8. The component mounting apparatus according to claim 1, wherein
the component mounting means includes a suction nozzle to suck the component and a mark camera configured to image the reference position and the component within the accommodation section, and
the suction position setting means determines the difference based on images from the mark camera.

9. The component mounting apparatus according to claim 5, further comprising:
a mounting head controlled by the processing circuitry to suck the component supplied by the component supplying device at the suction position, the mounting head including a suction nozzle to suck the component and a mark camera configured to image the reference position and the component within the accommodation section,
wherein the processing circuitry determines the difference based on images from the mark camera.

10. The component mounting apparatus according to claim 1, wherein
the accommodation member is a carrier tape and the reference position is a center of a feeding hole of the carrier tape.

11. The component mounting apparatus according to claim 5, wherein
the reference position is a center of a feeding hole of the carrier tape.

* * * * *